(12) United States Patent
Yamamoto (10) Patent No.: US 6,343,087 B2
(45) Date of Patent: *Jan. 29, 2002

(54) SEMICONDUCTOR LASER (75) Inventor: Tsuyoshi Yamamoto, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/154,244

(22) Filed: Sep. 16, 1998

(30) Foreign Application Priority Data

Sep. 17, 1997 (JP) .............................. 9-252466

(51) Int. Cl.$^7$ ................................. H01S 5/00
(52) U.S. Cl. ......................... 372/46; 372/45
(58) Field of Search .............. 372/45, 46, 50

(56) References Cited

U.S. PATENT DOCUMENTS

| 5,107,318 | A | * | 4/1992 | Makiuchi | 357/30 |
| 5,821,627 | A | * | 10/1998 | Mori | 257/780 |
| 5,838,703 | A | * | 11/1998 | Lebby | 372/43 |
| 5,883,914 | A | * | 3/1999 | Kinoshita | 372/50 |
| 6,018,539 | A | * | 1/2000 | Kimura | 372/45 |

FOREIGN PATENT DOCUMENTS

JP 8-46295 2/1996

OTHER PUBLICATIONS

Electronics Letters, Aug. 17, 1995, vol. 31, No. 17, pp. 1443–1445.
IEEE Photonics Technology Letters, vol. 8, No. 4, Apr. 1996, pp. 479–481.
Second Optoelectronics & Communications Conference (OECC '97) Technical Digest, Jul. 1997, Seoul, Korea, pp. 444–445.

* cited by examiner

Primary Examiner—Teresa M. Arroyo
Assistant Examiner—Gioacchino Inzirillo
(74) Attorney, Agent, or Firm—Armstrong, Westerman, Hattori, McLeland & Naughton, LLP

(57) ABSTRACT

An active layer is formed on the principal surface of a semiconductor substrate continuously at least from a laser output plane to a laser reflection plane, the active layer being gradually thinned toward the output plane in a region to a certain distance from the output plane toward the reflection plane. A ridge is formed on the active layer, extending from the output plane to the reflection plane and gradually increasing a width toward the output plane in a region to a first distance from the output plane, an upper surface of the ridge in a first region to a second distance from the output plane being set higher than an upper surface of the ridge in a second region other than the first region. A mesa structure is formed on the principal surface of the semiconductor substrate in areas on both sides of the ridge, the mesa structure having an upper surface defining a virtual flat plane at a position flush with or higher than a highest upper surface of the ridge.

17 Claims, 8 Drawing Sheets

SEMICONDUCTOR LASER

This application is based on Japanese Patent Application No. 9-252466 filed on Sep. 17, 1997, the entire contents of which are incorporated herein by reference.

BACKGROUND OF THE INVENTION

1. Field of the Invention

The present invention relates to a semiconductor laser, and more particularly to a ridge-type semiconductor laser integrated with a spot size converter.

In optical fiber communications, a single optical fiber can transmit a large amount of information. It is therefore desirable to broaden the application field from current trunk line networks to subscriber networks, to local area networks (LAN) and the like. In order to realize this, a lower initial cost is necessary so that optical coupling between an optical semiconductor element in an optical module and an optical fiber is made easy.

In facilitating optical coupling, a semiconductor laser integrated with a spot size converter has drawn much attention. If the spot size of a laser beam radiated from a semiconductor laser is made large, a high coupling efficiency can be realized without using a lens, and, in addition, a position alignment margin becomes large so that a work of optical coupling is simplified.

2. Description of the Related Art

Figure 8:
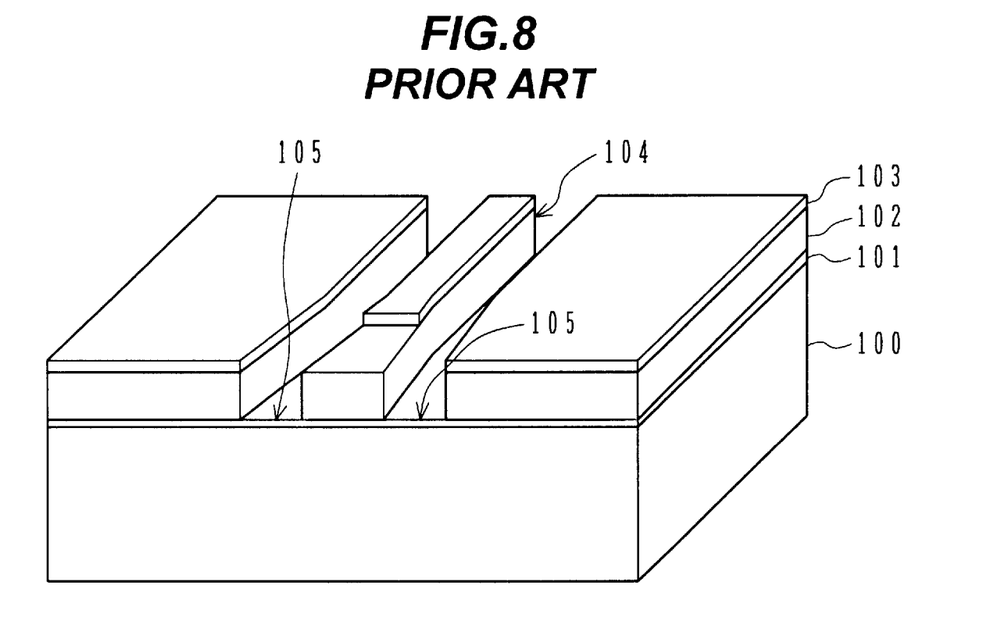
FIG. 8 is a perspective view of a conventional semiconductor laser.

FIG. 8 is a perspective view of a conventional ridge-type semiconductor laser. On a substrate 100 made of n-type semiconductor material, an active layer 101 having a quantum well structure, a p-type cladding layer 102, and a p-type contact layer 103 are stacked in this order from the bottom. The active layer 101 is gradually thinned toward an output plane (front plane as viewed in FIG. 8) in the nearby area of the output plane.

Two continuous grooves 105 are formed extending from the output plane to the opposite reflection plane. The groove 105 extends from the upper surface of the contact layer 103 to the lower surface of the p-type cladding layer 102. A ridge 104 is defined between the two grooves 105. The ridge 104 is gradually broadened toward the output plane in the nearby area of the output plane.

The spot size of light propagating in the active layer 101 in the ridge 104 becomes larger toward the output plane. The broadened area at the output plane of the ridge 104 corresponds to an expansion of the spot size.

As the quantum well layer of the active layer 101 becomes thin, the band gap of the quantum well structure broadens and the nearby area of the output plane of the active layer 101 becomes transparent relative to an oscillated laser beam. Since current injected into this nearby area does not contribute to laser oscillation, a wasteful power consumption increases. Furthermore, if free carriers are generated in the nearby area of the output plane when current is injected into this nearby area, free carrier absorption occurs to increase a loss of laser beam. It is therefore unnecessary to inject current into this nearby area.

In order to suppress current injection into the nearby area of the output plane of the active layer 101, the contact layer 103 in the upper region of the ridge 104 in the nearby area of the output plane is removed and the current injection electrode is not formed.

In order to facilitate optical coupling to an optical fiber or the like, a laser chip is mounted on a mount substrate through junction-down with its upper surface directed to the mount substrate. In order to facilitate to mounting of laser chip on the mount substrate, a lamination structure having a flat surface and the same height as that of the ridge 104 is left on both sides of the ridge 104.

Since the spot size of a laser beam becomes large in the nearby area of the output plane, the ridge 104 is formed to be thick in correspondence with the large spot size. The spot size of a laser beam in the area on the opposite reflection plane side where the active layer 101 has a uniform thickness, is not so large as that on the output plane side. However, the ridge 104 in this area is also formed thick in correspondence with the thickness of the ridge 104 in the nearby area of the output plane.

In order to obtain a single lateral mode of light, the width of the ridge 104 is generally narrowed to about 2 to 3 $\mu$m. In contrast with this, its height is set to about 4 to 5 $\mu$m so as to match the large spot size. Such an increase in thickness of the ridge 104 results in an increase in resistance of the p-type cladding layer 102, and when large current is injected, heat is generated and the laser performance may be degraded.

SUMMARY OF THE INVENTION

It is an object of the present invention to provide a ridge type semiconductor laser capable of suppressing an increase in resistance of the upper cladding layer and making it easy to mount the laser chip on a mount substrate.

According to one aspect of the present invention, there is provided a semiconductor laser comprising: a semiconductor substrate of a first conductivity type having a principal surface, a laser output plane, and a laser reflection plane opposite to the laser output plane; an active layer formed on the principal surface of the semiconductor substrate continuously at least from the output plane to the reflection plane, the active layer being gradually thinned toward the output plane in a region to a certain distance from the output plane toward the reflection plane; a ridge generally of a ridge shape formed on the active layer and made of semiconductor material, the ridge extending from the output plane to the reflection plane and gradually increasing a width toward the output plane in a region to a first distance from the output plane, an upper surface of the ridge in a first region to a second distance from the output plane being set higher than an upper surface of the ridge in a second region other than the first region, and at least a portion of the second region being of a second conductivity type opposite to the first conductivity type; and a mesa structure formed on the principal surface of the semiconductor substrate in areas on both sides of the ridge, the mesa structure having an upper surface defining a virtual flat plane at a position flush with or higher than a highest upper surface of the ridge.

The spot size of a laser beam becomes large in the active layer in the nearby area of the output plane where the active layer is made thin. In correspondence with an increase in spot size, the ridge is made wide and thick. In the area where the spot size is small, the ridge is made thin. Current is injected into the active layer from this thin area, an increase in resistance of the ridge can be suppressed. Since the upper surface of a mesa structure is made in contact with a mount substrate, the semiconductor laser can be mounted reliably on the mount substrate.

DETAILED DESCRIPTION OF THE PREFERRED EMBODIMENTS

Figure 1A:
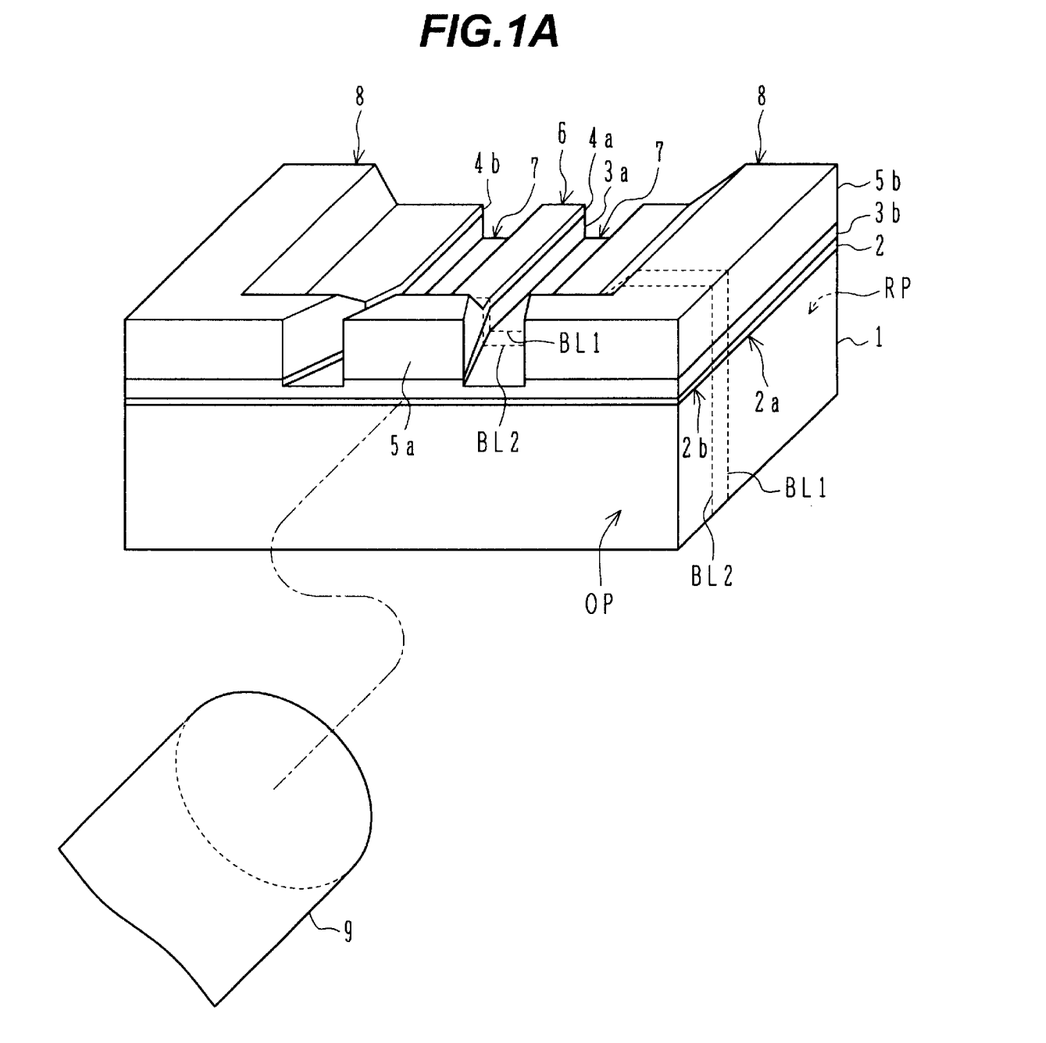
FIG. 1A is a perspective view of a semiconductor laser according to a first embodiment of the invention.

FIG. 1A is a perspective view of a semiconductor laser according to the first embodiment of the invention. A core layer 2 is formed on a semiconductor substrate 1 having an output plane OP and a reflection plane RP of a laser beam. A region 2b of the core layer 2 on the output plane OP side from a first boundary plane BL1 which is parallel to the output plane OP, is gradually thinned toward the output plane OP, and a region 2a on the reflection plane RP side has generally a constant thickness. For example, a first distance from the output plane OP to the first boundary plane BL1 is 200 μm and a distance from the first boundary plane BL1 to the reflection plane RP is 300 μm.

Figure 1B:
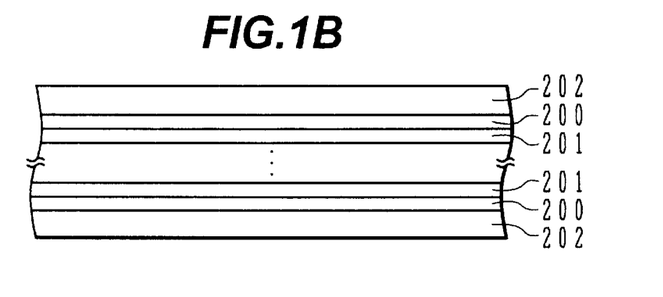
FIG. 1B is a cross sectional view of a core layer of the semiconductor laser shown in FIG. 1A.

The semiconductor substrate 1 is an n-type InP substrate having a plane (100) and an Sn concentration of about $2 \times 10^{18} cm^{-3}$. As shown in FIG. 1B, the core layer 2 has structure in which a lamination structure (active layer) made of six InGaAsP barrier layers 200 and five InGaAsP well layers 201 are alternately stacked upon one another. This lamination structure is sandwiched between two InGaAsP guide layers 202 having a band gap corresponding to a wavelength of 1.1 μm. The InGaAsP barrier layers 200 have a band gap corresponding to a wavelength of 1.1 μm and the InGaAsP well layers 201 have a band gap corresponding to a wavelength of 1.35 μm.

In the region 2a, the thicknesses of the barrier layer 200, well layer 201, and guide layer 202 are 10 nm, 6 nm, and 100 nm, respectively. The thicknesses of these layers at the output plane OP are about a third of those of the layers in the region 2a.

A ridge 6 is formed on the core layer 2 along a direction perpendicular to the output plane OP, extending from the output plane OP to the reflection plane RP. A region of the ridge 6 on the output plane OP side from the first boundary plane BL1 is broadened toward the output plane OP, and a region on the reflection plane RP side has generally a uniform width. For example, the uniform width of the ridge 6 is about 2 μm and the width at the output plane OP is about 7 μm.

The lower region of the ridge 6 is constituted of a p-type InP upper cladding layer 3a having a Zn concentration of about $2 \times 10^{18} cm^{-3}$ and a thickness of about 1.5 μm. A contact layer 4a is formed on the upper surface of the upper cladding layer 3a in an area on the reflection plane RP side from a second boundary plane BL2. For example, a second distance from the output plane OP to the second boundary plane BL2 is 120 μm. The contact layer 4a is made of p-type InGaAs having a Zn concentration of about $1 \times 10^{19} cm^{-3}$ and a thickness of 0.5 μm.

A high resistance layer 5a is formed on the upper surface of the cladding layer 3a in an area on the output plane OP side from the second boundary plane BL2. The high resistance layer 5a has a thickness of about 3.5 μm and is made of InP doped with Fe at about $1 \times 10^{16} cm^{-3}$ to increase its resistance. The upper surface of the high resistance layer 5a is inclined in the partial region on the second boundary plane BL2 side, and becomes continuous with the upper surface of the contact layer 4a.

A thickness of the ridge 6 in the nearby area of the output plane OP is a total thickness of the upper cladding layer 3a and high resistance layer 5a, and is about 5.0 μm. Light generated in the core layer 2 progresses along the ridge 6 and is amplified through stimulated emission. The spot size of a laser beam becomes large in the nearby area of the output plane OP where the core layer 2 is thinned. A total thickness of the upper cladding layer 3a and high resistance layer 5a is made sufficiently thick so as not to make a laser beam creep under the substrate. A laser beam with a spot size made larger is emitteds from the output plane OP.

A mesa structure 8 is formed on the upper surface of the active layer 2 on both sides of the ridge 6, with a groove 7 being formed therebetween. A lower region of the mesa structure 8 is constituted of a p-type InP layer 3b deposited by the same process as that of forming the upper cladding layer 3a. A region of the mesa structure in the nearby area of the groove 7 is constituted of a p-type InGaAs layer 4b deposited on the surface of the p-type InP layer 3b by the same process as that of forming the contact layer 4a. The other region of the mesa structure is constituted of a high resistance InP layer 5b deposited by the same process as that of forming the high resistance layer 5a.

An optical fiber 9 is disposed facing its one end toward the output plane OP. A laser beam emitted from the output plane OP enters the optical fiber 9. Since the spot size of the laser beam is made large in the nearby area of the output plane OP, optical coupling between the semiconductor laser and optical fiber can be made easy.

Figure 2A:
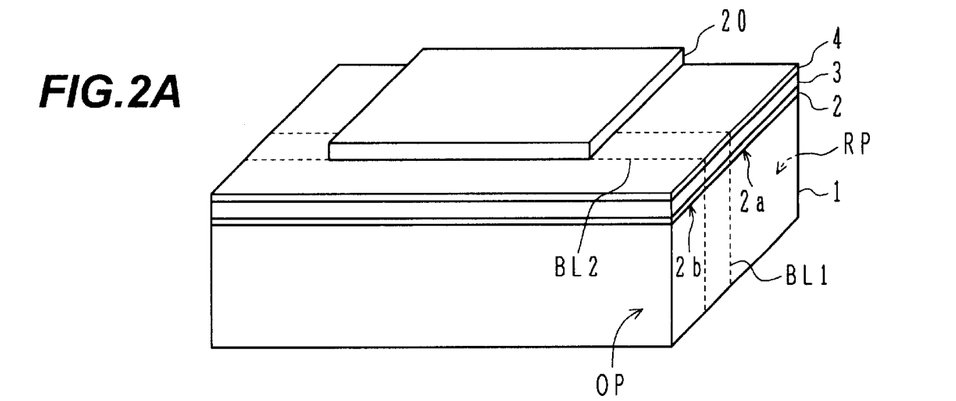
FIGS. 2A to 2C are perspective views of a unit chip, illustrating a method of manufacturing the semiconductor laser of the first embodiment.
Figure 2B:
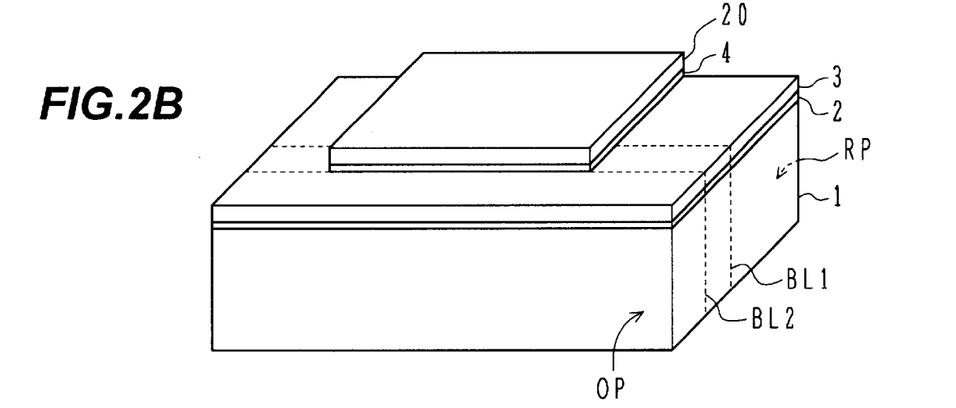
Figure 2C:
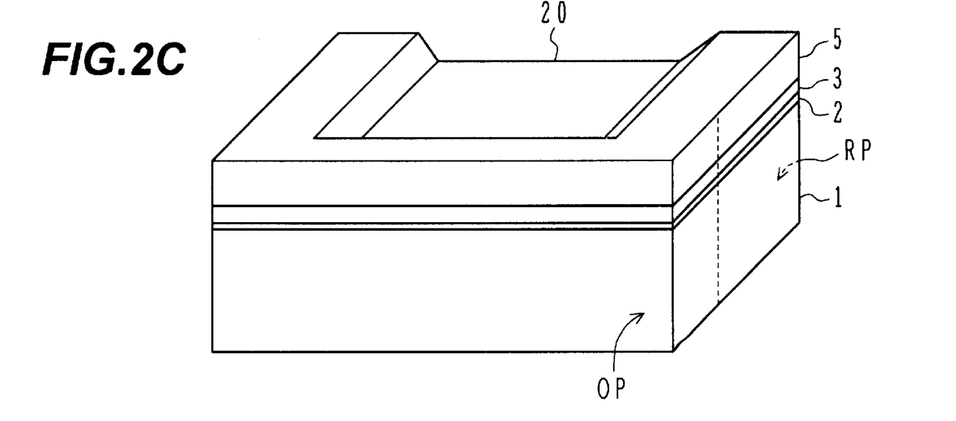

Next, a method of manufacturing the semiconductor laser shown in FIG. 1A will be described with reference to FIGS. 2A to 2C. Although a unit chip obtained by scribing a semiconductor substrate is shown in FIGS. 2A to 2C, a substrate is separated into unit chips in practice after all wafer processes are completed. In order to make it easy to understand, the description is given by paying attention to a unit chip.

As shown in FIG. 2A, a semiconductor substrate 1 is prepared which is made of InP and has an Sn concentration of about $2 \times 10^{18} cm^{-3}$. A front cleavage surface as viewed in FIG. 2A is the output plane OP of a laser beam, and the opposite cleavage surface is the reflection plane RP. Cleavage is performed after the laser structures are formed.

A core layer 2 is deposited on the principal surface of the semiconductor substrate 1, by low pressure metal organic chemical vapor deposition (low pressure MOCVD) using a shadow mask. As described earlier, the core layer 2 has the structure having a lamination structure (active layer) made of six barrier layers, five well layers, and two guide layers. The barrier layers and the well layers are alternately stacked upon one another. This lamination layers are sandwiched between the two guide layers. The barrier layers are constituted of InGaAsP having a band gap corresponding to a wavelength of 1.1 µm. The well layers are constituted of InGaAsP having a band gap corresponding to a wavelength of 1.35 µm. The guide layers are constituted of InGaAsP having a band gap corresponding to a wavelength of 1.1 µm. For example, source materials used for depositing each layer are trimethylindium (TMI), triethylgallium (TEG), arsine (AsH$_3$), and phosphine (PH$_3$), and the substrate temperature during film formation is about 620° C.

With low pressure MOCVD using a shadow mask, a shadow mask is placed over, and spaced by a predetermined distance from, the principal surface of the semiconductor substrate 1. This shadow mask masks the principal surface of the semiconductor substrate 1 in the nearby area of the output plane OP, and opens the principal surface in the area on the reflection plane RP side from the first boundary plane BL1. Therefore, the thickness of the core layer 2a deposited in the area on the reflection plane RP side from the first boundary plane BL1 becomes generally uniform, and the thickness of the core layer 2b deposited in the nearby area on the output plane OP side from the first boundary plane BL1 is gradually thinned toward the output plane OP.

After the shadow mask is removed, a p-type InP layer 3 having a thickness of 1.2 µm and a p-type InGaAs layer 4 having a thickness of 0.5 µm are deposited on the core layer 1 in this order from the bottom. Source materials used for depositing these layers and the substrate temperature are the same as those used for the core layer 2. Source material for p-type impurities Zn is, for example, dimethylzinc (DMZn).

An SiO$_2$ film is deposited on the surface of the p-type InGaAs layer 4, and patterned to leave a mask pattern 20. The mask pattern 20 exposes a surface area of the p-type InGaAs layer 4 on the output plane OP side from the second boundary plane BL2 spaced by the second distance of 120 µm from the output plane OP and a nearby surface area of the side surfaces (cleavage surfaces other than the output plane OP and reflection plane RP), and covers the other surface area of the p-type InGaAs layer 4.

As shown in FIG. 2B, by using the mask pattern 20 as a mask, the p-type InGaAs layer 4 is partially etched. For example, the InGaAs layer 4 is etched by reactive ion etching (RIE) using a mixture gas of CH$_4$, H$_2$ and O$_2$.

As shown in FIG. 2C, on the exposed surface of the p-type InP layer 3, an InP layer having a thickness of 3.5 µm and doped with Fe to make it a high resistance is selectively deposited around the mask pattern 20. For example, source material of Fe is ferrocene. Near at the edge of the mask pattern 20, the upper surface of the high resistance InP layer 5 is slanted. After the high resistance InP layer 5 is deposited, the mask pattern 20 is removed.

Reverting to FIG. 1, the processes after the above processes will be described. A mask pattern of SiO$_2$ having openings corresponding to the grooves 7 is formed on the high resistance InP layer 5 and p-type InGaAs layer 4. By using this mask pattern as a mask, the InGaAs layer 4, high resistance InP layer 5, and p-type InP layer 3 are etched to form the grooves 7. In the nearby area of the output plane OP, a lower region of the p-type InP layer 3 is left. Etching these layers is performed by RIE using ethane containing etching gas. In the above manner, the ridge 6 is formed.

As will be later described with reference to FIG. 3, after the electrode is formed, the semiconductor wafer is scribed and cleaved to separate it into unit chips. If necessary, the output plane OP may be coated for low-reflection and the reflection plane RP may be coated for high-reflection.

Of the ridge 6, the region on the output plane OP side from the second boundary plane BL2 has a lamination structure of the p-type InP upper cladding layer 3a and high resistance InP layer 5a, whereas the region on the reflection plane RP side from the second boundary plane BL2 has a lamination structure of the p-type InP upper cladding layer 3a and InGaAs contact layer 4a.

The mesa structure 8 is formed on both sides of the ridge 6, with the groove 7 being interposed therebetween. The highest upper surface of the mesa structure 8 has a height same as the highest upper surface of the high resistance layer 5a. This level plane defines a virtual flat plane parallel to the principal surface of the semiconductor substrate 1. Since the thickness of the core layer 2 is gradually thinned in the nearby area of the output plane OP, principally the upper surface of the mesa structure 8 is gradually lowered toward the output plane OP. However, a change in the thickness of the core layer 2 is very small as compared to the thickness of the p-type InP layer 3 and high resistance InP layer 5 deposited on the core layer 2. Therefore, it can be considered that the highest upper surface of the mesa structure 8 is substantially flat.

Of the ridge 6, the current injection region with the contact layer 4a is thinner than the region on the output plane OP side. Therefore, as compared to a conventional ridge having the same thickness over the whole length thereof from the output plane OP to reflection plane RP, the resistance of the embodiment ridge 6 can be lowered. Since the resistance is lowered, heat generation when injection current is made large can be suppressed and the stable operation is ensured.

In the first embodiment described above, the high resistance InP layer 5a is deposited on the upper cladding layer 3a of the ridge 6 in the nearby area of the output plane OP. Instead of the high resistance InP layer 5a, an n-type InP layer may be used. In this case, an inverse bias is applied during operation to the interface between the n-type InP layer and p-type upper cladding layer 3a. Therefore, current injected to the core layer 2 in the nearby area of the output plane OP can be suppressed similar to using the high resistance layer. If current injection into this region of the core layer 2 does not pose any practical problem, a p-type InP layer may be formed instead of the high resistance InP layer 5a.

Further, in the first embodiment, although the lower region of the p-type upper cladding layer 3 is partially left on the bottom of the groove 7 only in the nearby area of the output plane OP, the core layer 2 may be exposed in this nearby area. A portion of the cladding layer 3 may be left on the bottom over the whole length of the groove from the output plane OP to the reflection plane RP.

Furthermore, in the first embodiment, in the process shown in FIG. 2C, the high resistance InP layer 5 is deposited by selective growth. Instead of selective growth, the high resistance InP layer 5 may be formed in the following manner. After the process shown in FIG. 2B, the mask pattern 20 is removed and a high resistance InP layer is deposited over the whole surface of the substrate 1 and patterned to form the high resistance InP layer 5 having the pattern shown in FIG. 2C.

Next, with reference to FIG. 3, the electrode structure of the semiconductor laser of the first embodiment will be described.

Figure 3:
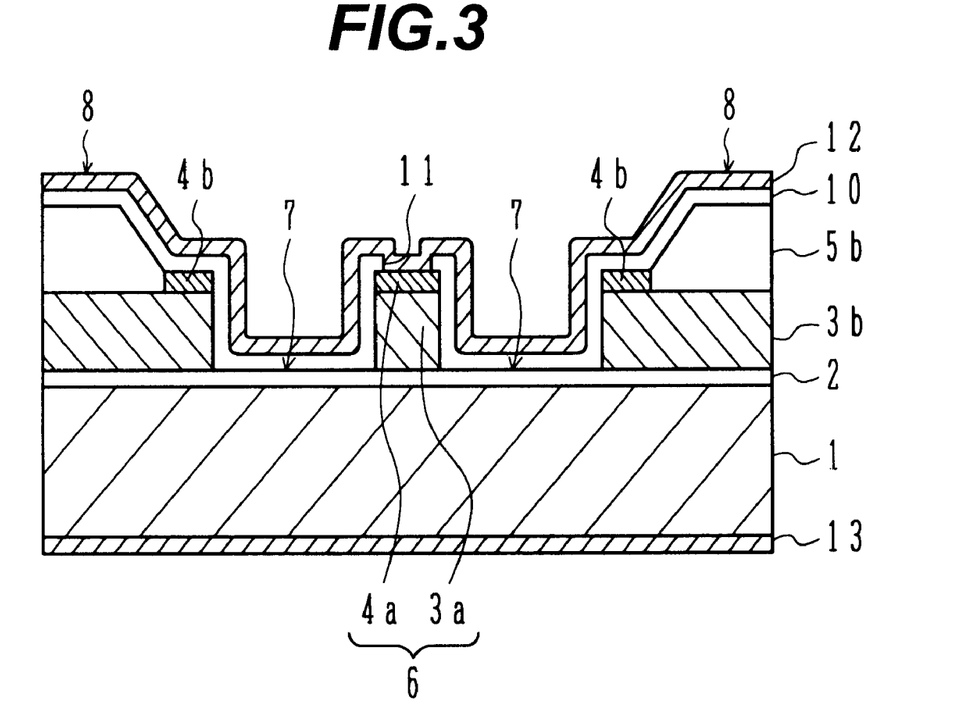
FIG. 3 is a cross sectional view of the semiconductor laser of the first embodiment.

FIG. 3 is a cross sectional view of a plane parallel to the reflection plane RP between the first boundary plane BL1 and reflection plane RP shown in FIG. 1. An SiO$_2$ film 10 having a thickness of about 0.3 µm is formed covering the surfaces of the ridge 6 and mesa structure 8 and the inner surface of the grooves 7. An opening 11 is formed through the SiO$_2$ film 10 in the area corresponding to a partial area of the contact layer 4a. An upper electrode 12 is formed on the SiO$_2$ film 10, the upper electrode 12 having a three-layer structure of Ti, Pt and Au in this order from the bottom. The upper electrode 12 has an ohmic contact with the contact layer 4a at the bottom of the opening 11.

A lower electrode 13 having a two-layer structure of an AuGe alloy layer and an Au layer is formed on the bottom of the semiconductor substrate 1.

Figure 4:
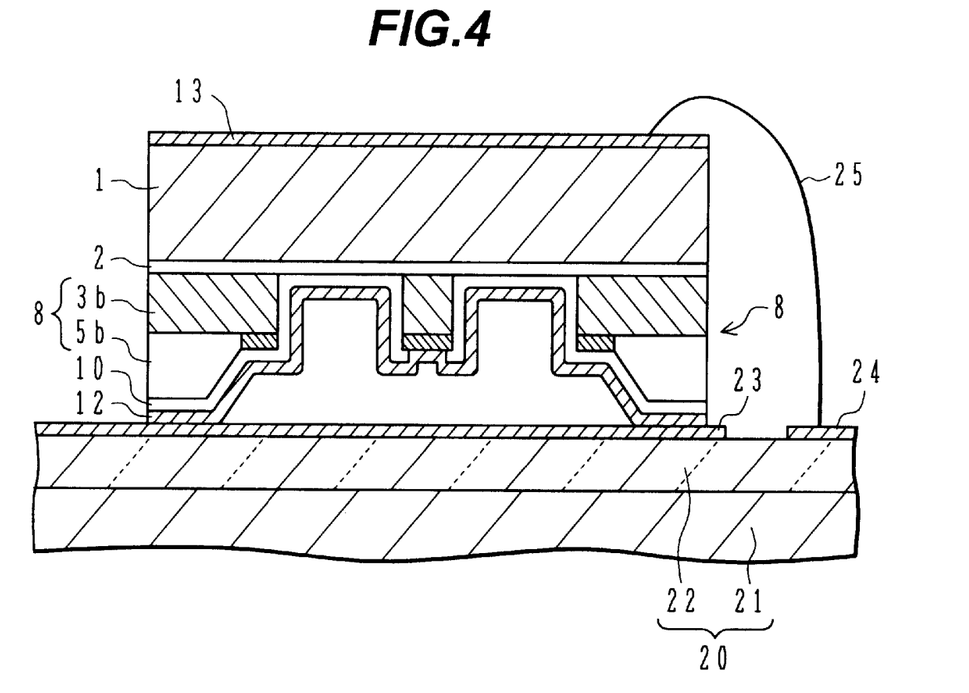
FIG. 4 is a cross sectional view of the semiconductor laser of the first embodiment assembled on a mount substrate.

FIG. 4 is a cross sectional view of the semiconductor laser shown in FIG. 3 mounted on a mount substrate. The mount substrate 20 is constituted of a silicon substrate 21 and an Sio$_2$ film 22 formed on the surface of the silicon substrate 21. Interconnect patterns 23 and 24 are formed on the surface of the SiO$_2$ film 22. Each interconnect pattern is made of AuSn alloy.

The semiconductor laser is mounted on the mount substrate 20, with its upper surface being directed to the mount substrate. The upper electrode 12 on the highest surface area of the mesa structures 8 is connected to the interconnect pattern 23 through thermocompression bonding. The lower electrode 13 is connected via a lead wire 25 to the interconnect pattern 24.

The upper surfaces (lower surfaces as in FIG. 4) of the mesa structures 8 define a virtual flat plane parallel to the principal surface of the semiconductor substrate 1. Therefore, the semiconductor laser can be reliably mounted on the mount substrate 20. Since each layer constituting the mesa structure 8 is formed to have a precise thickness through MOCVD, the core layer 2 can be aligned highly precisely along a height direction relative to the mount substrate 20. Also in the in-plane direction, high position alignment is possible by using a position alignment mark formed on the surface of the mount substrate 20.

A V-groove is formed in an unrepresented region of the mount substrate 20 in order to place an optical fiber at a correct position. If the V-groove is formed with highly precise in-plane position and depth, the optical fiber and semiconductor laser can be positioned with high precision. Therefore, without using optical coupling evaluation light, highly reliable position alignment is possible relying upon only mechanical precision.

In the first embodiment shown in FIG. 1, the upper surface of the mesa structure 8 is flush with the upper surface of the high resistance layer 5a. Even if the upper surface of the mesa structure 8 is higher than the upper surface of the high resistance layer 5a, the semiconductor laser can be reliably mounted on a mount substrate.

Next, the second embodiment of the invention will be described.

Figure 5A:
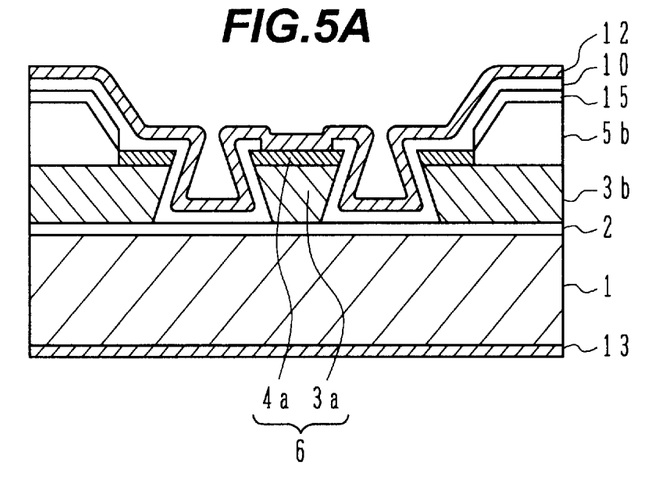
FIGS. 5A and 5B are a cross sectional view and a perspective view of a semiconductor laser according to a second embodiment of the invention.
Figure 5B:
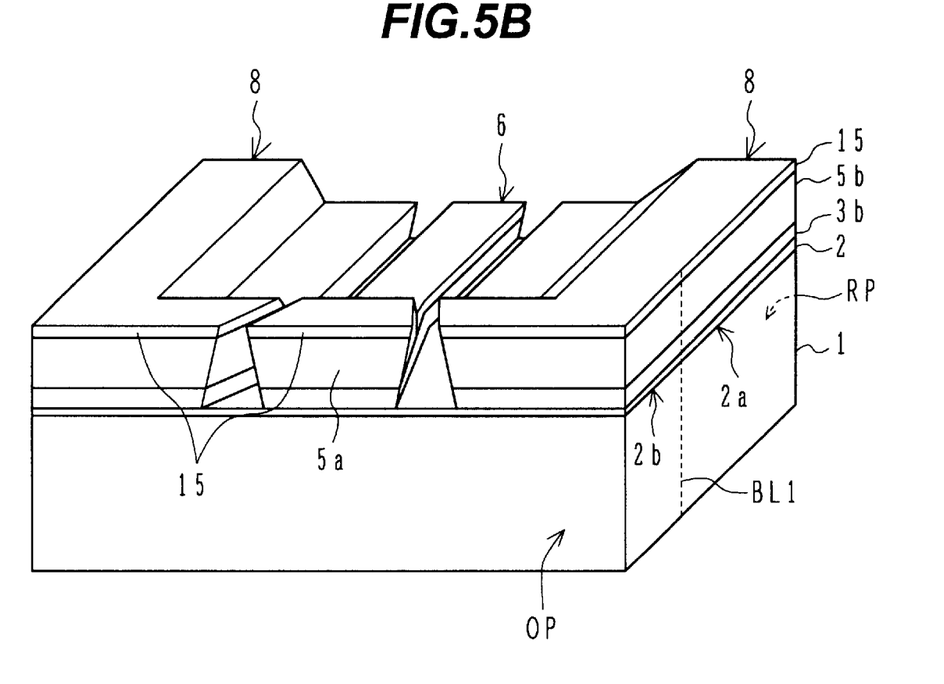

FIGS. 5A and 5B are a cross sectional view and a perspective view showing a semiconductor laser according to the second embodiment. In the first embodiment, the grooves 7 shown in FIG. 1A are formed by anisotropic RIE after the process shown in FIG. 2C. The side wall of the ridge 6 is therefore generally vertical to the principal surface of the semiconductor substrate 1. In the second embodiment, the grooves 7 are formed by wet etching using HBr containing etchant. The ridge 6 has therefore an inverse mesa structure shown in FIG. 5A. The side wall of the groove 7 has a plane (111)A. In other words, the width of a cross section of the ridge 6 parallel to the output plane OP is gradually broadened as the distance from the core layer 2 becomes longer.

With the inverse mesa structure of the ridge 6, a contact area between the upper electrode 12 and contact layer 4a becomes large so that the resistance of the ridge 6 can be lowered.

Consider now that the grooves 7 of the first embodiment shown in FIG. 1A are formed by isotropic etching. In the region of the ridge 6 on the reflection plane RP side from the second boundary plane BL2, the p-type InP upper cladding layer 3a is covered with the InGaAs contact layer 4a, whereas in the other region the upper surface of the high resistance InP layer 5a is directly covered with the mask pattern of SiO$_2$. Since the compositions of the materials under the mask pattern are different in these two regions, side etching speeds are different. Therefore, the side walls of the ridge 6 at the second boundary plane BL2 may not smoothly couple together.

In order to avoid this, it is preferable that as shown in FIG. 5B, an InGaAs layer 15 is formed also on the upper surface of the high resistance InP layer 5a. The InGaAs layer 15 is deposited following the deposition of the high resistance InP layer 5 in the process shown in FIG. 2C. The InGaAs layer 15 is deposited also on the upper surfaces of the mesa structures 8.

Next, the third embodiment of the invention will be described.

Figure 6:
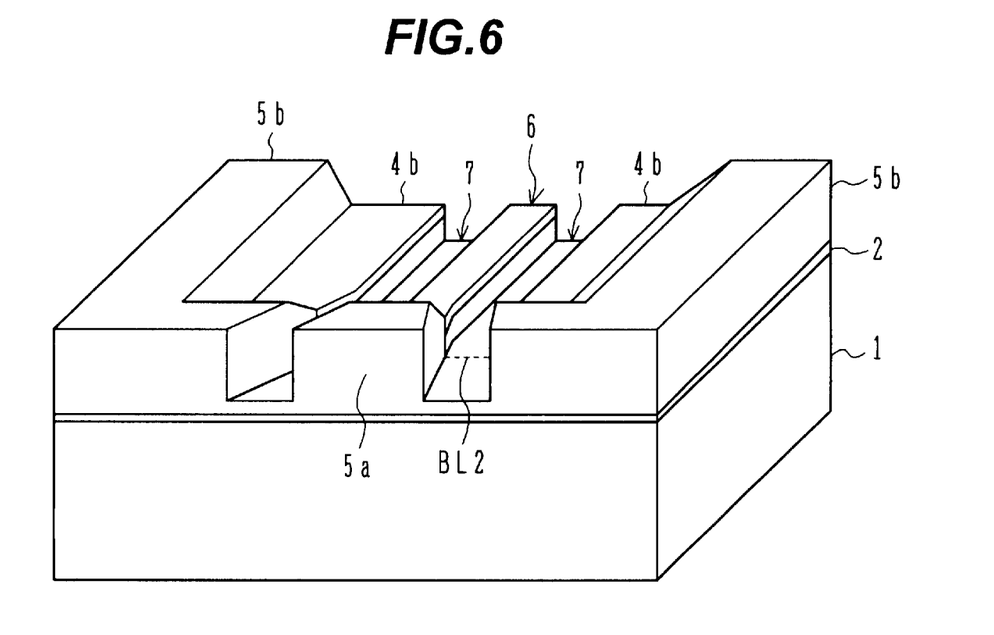
FIG. 6 is a perspective view of a semiconductor laser according to a third embodiment of the invention.

FIG. 6 is a perspective view of a semiconductor laser according to the third embodiment. In the first embodiment shown in FIG. 1A, the region of the ridge 6 on the output plane OP side from the second boundary plane BL2 is a lamination of the p-type InP upper cladding layer 3a and high resistance InP layer 5a.

In the third embodiment shown in FIG. 6, the region of the ridge 6 on the output plane OP side from the second boundary plane BL2 is made of only the high resistance InP layer 5a. This structure is formed, in the process of FIG. 2B of the first embodiment, by etching the InP layer 3 following the etching of the InGaAs layer 4 by using the mask pattern 20 as a mask.

The whole region of the ridge 6 near the output plane OP is made of the high resistance layer so that current injected into the core layer 2 just under this region can be suppressed further.

Next, the fourth embodiment of the invention will be described.

In the first embodiment, the core layer 2 is deposited by using the shadow mask in the process shown in FIG. 2A to thereby change the thickness of the core layer 2. In the fourth embodiment, the thickness of the core layer 2 is changed gradually by selective growth using a mask pattern.

Figure 7A:
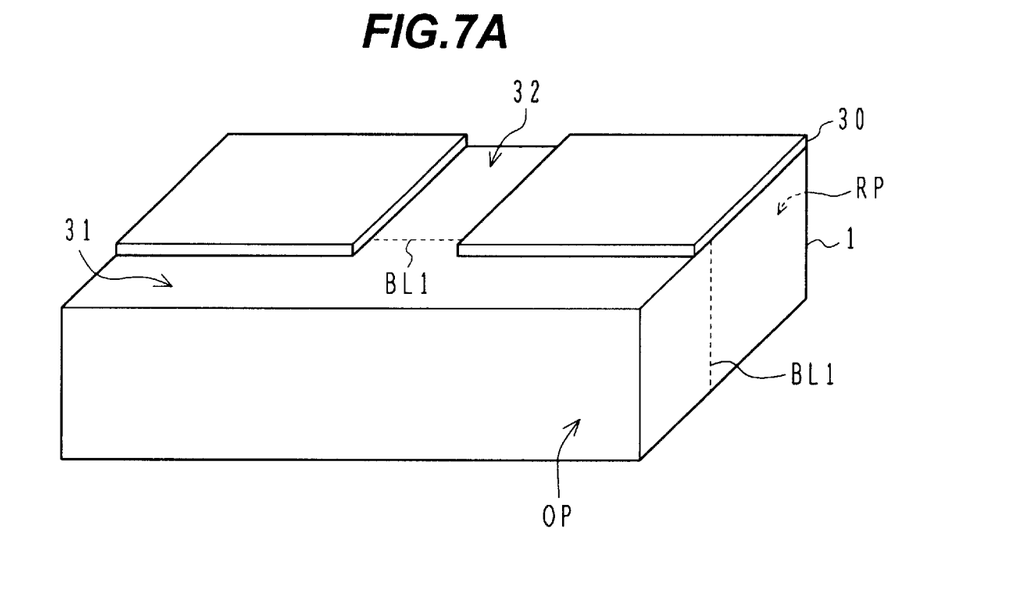
FIG. 7A is a perspective view of a unit chip, illustrating a method of manufacturing a semiconductor chip according to a fourth embodiment of the invention.

FIG. 7A is a perspective view of a semiconductor substrate before the core layer 2 is deposited. A mask pattern 30 of SiO$_2$ is formed on the principal surface of the semiconductor substrate 1. This mask pattern 30 exposes an area 31 of the principal surface to some distance from the output plane OP and an area 32 where the ridge 6 is formed, and covers the other areas.

When the core layer 2 is deposited on this substrate, the growth speed in the area 32 surrounded by the mask pattern 30 is fast, and the growth speed is lowered toward the output plane OP. Therefore, the thickness of the core layer 2 is gradually thinned toward the output plane OP in the nearby area of the output plane OP where the ridge 6 is formed. The first boundary plane BL1 between the region where the thickness of the core layer 2 is uniform and the region where the thickness is gradually thinned, shifts slightly toward the reflection plane RP from the edge of the mask pattern 30 on the output plane OP side. The first boundary plane BL1 can be set to a desired position by forming the mask pattern 30 taking into consideration the position shift between the first boundary plane BL1 and the edge of the mask pattern 30 on the output plane OP side.

After the core layer 2 is deposited, the mask pattern 30 is removed. The succeeding processes are similar to the first embodiment shown in FIGS. 2A to 2C.

Figure 7B:
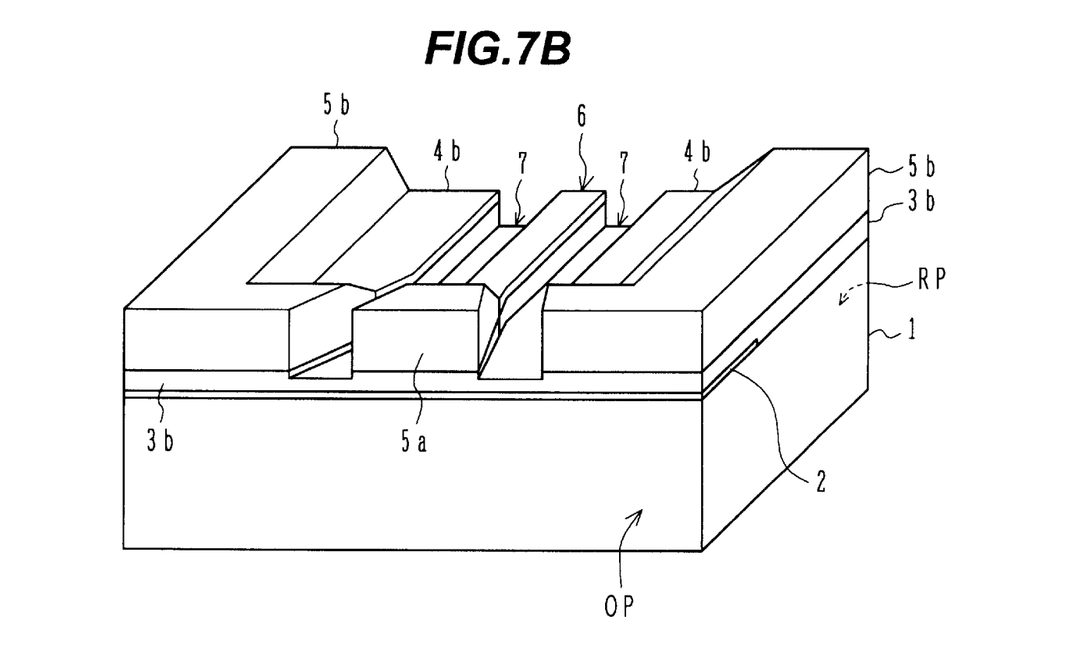
FIG. 7B is a perspective view of the semiconductor laser of the fourth embodiment.

FIG. 7B is a perspective view of a semiconductor laser according to the fourth embodiment. In the first embodiment shown in FIG. 1, the core layer 2 appears on the side surface of the semiconductor substrate 1, continuously from the output plane OP to reflection plane RP. In the fourth embodiment, the core layer 2 appears on the side surfaces of the semiconductor substrate 1, from the output plane OP to the edge of the mask pattern 30 shown in FIG. 7A on the output plane OP side. In this manner, the thickness of the core layer 2 can be changed gradually through selective growth using the mask pattern 30.

The present invention has been described in connection with the preferred embodiments. The invention is not limited only to the above embodiments. It is apparent that various modifications, improvements, combinations, and the like can be made by those skilled in the art.

What is claimed is:

1. A semiconductor laser comprising:
   a semiconductor substrate of a first conductivity type having a principal surface, a laser output plane, and a laser reflection plane opposite the laser output plane;
   an active layer formed on the principal surface of said semiconductor substrate continuously at least from the output plane to the reflection plane, said active layer being gradually thinned toward the output plane in a region from a certain distance from the output plane toward the output plane;
   a ridge formed on said active layer and made of semiconductor material, said ridge extending from the output plane to the reflection plane and gradually increasing in width in a region from a first distance from the output plane toward the output plane, an upper surface of said ridge being set higher in a first region from a second distance from the output plane than an upper surface of said ridge in a second region other than the first region, and at least a portion of the second region being of a second conductivity type opposite the first conductivity type; and
   a mesa structure formed on the principal surface of said semiconductor substrate in areas on both sides of said ridge, said mesa structure being made of the same material as said first region and having an upper surface defining a virtual flat plane at a position flush with a highest upper surface of said ridge.

2. A semiconductor laser according to claim 1, wherein a lower layer of said ridge is a cladding layer made of semiconductor material of the second conductivity type, and the first region includes the cladding layer and a high resistance layer formed on the cladding layer and having a resistance higher than the cladding layer or a semiconductor layer of the first conductivity type formed on the cladding layer.

3. A semiconductor laser according to claim 1, wherein the first region is made of semiconductor material having a resistance higher than the second region.

4. A semiconductor laser according to claim 1, wherein the first region and the second region each have a lamination structure, a highest upper layer of the lamination structure being made of semiconductor material having a same composition in both the first region and the second region, and the highest upper layer having an etching resistance different from a layer under the highest upper layer.

5. A semiconductor laser according to claim 1, further comprising:
   an insulating film covering continuously from an upper surface of said mesa structure to an upper surface of said ridge and having an opening in an area corresponding to at least a partial upper surface of the second region of said ridge; and
   a conductive film formed on at least a partial upper surface of said insulating film and extending to an upper surface of said mesa structure, said conductive film being electrically connected to said ridge in an area where said opening of said insulating film is formed.

6. A semiconductor laser according to claim 1, wherein a lower layer of said ridge is a cladding layer made of semiconductor material of the second conductivity type, and the first region includes the cladding layer and a high resistance layer formed on the cladding layer and having a resistance higher than the cladding layer or a semiconductor layer of the first conductivity type formed on the cladding layer.

7. A semiconductor laser according to claim 1 wherein the first region is made of semiconductor material having a resistance higher than the second region.

8. A semiconductor laser according to claim 2, wherein the first region and the second region each have a lamination structure, a highest upper layer of the lamination structure being made of semiconductor material having a same composition in both the first region and the second region, and the highest upper layer having an etching resistance different from a layer under the highest upper layer.

9. A semiconductor laser according to claim 1, further comprising:
   an insulating film covering continuously from an upper surface of said mesa structure to an upper surface of said ridge and having an opening in an area corresponding to at least a partial upper surface of the second region of said ridge; and
   a conductive film formed on at least a partial upper surface of said insulating film and extending to an upper surface of said mesa structure, said conductive film being electrically connected to said ridge in an area where said opening of said insulating film is formed.

10. A semiconductor laser according to claim 2, further comprising:
    a mount substrate having a plurality of interconnect patterns formed on a surface of said mount substrate, one interconnect pattern being in contact with said conductive film in an upper surface area of said mesa structure; and
    a lead wire electrically connecting said semiconductor substrate to another interconnect pattern on the surface of said mount substrate.

11. A semiconductor laser according to claim 3, wherein the first region and the second region each have a lamination structure, a highest upper layer of the lamination structure being made of semiconductor material having a same composition in both the first region and the second region, and the highest upper layer having an etching resistance different from a layer under the highest upper layer.

12. A semiconductor laser according to claim 3, further comprising:
    an insulating film covering continuously from an upper surface of said mesa structure to an upper surface of said ridge and having an opening in an area corresponding to at least a partial upper surface of the second region of said ridge; and
    a conductive film formed on at least a partial upper surface of said insulating film and extending to an upper surface of said mesa structure, said conductive film being electrically connected to said ridge in an area where said opening of said insulating film is formed.

13. A semiconductor laser according to claim 3, further comprising:
   a mount substrate having a plurality of interconnect patterns formed on a surface of said mount substrate, one interconnect pattern being in contact with said conductive film in an upper surface area of said mesa structure; and
   a lead wire electrically connecting said semiconductor substrate to another interconnect pattern on the surface of said mount substrate.

14. A semiconductor laser according to claim 5, further comprising:
   a mount substrate having a plurality of interconnect patterns formed on a surface of said mount substrate, one interconnect pattern being in contact with said conductive film in an upper surface area of said mesa structure; and
   a lead wire electrically connecting said semiconductor substrate to another interconnect pattern on the surface of said mount substrate.

15. A semiconductor laser comprising:
   a semiconductor substrate of a first conductivity type having a principal surface, a laser output plane, and a laser reflection plane opposite the laser output plane;
   an active layer formed on the principal surface of said semiconductor substrate continuously at least from the output plane to the reflection plane, said active layer being gradually thinned toward the output plane in a region from a certain distance from the output plane toward the reflection plane;
   a ridge formed on said active layer and made of semiconductor material, said ridge extending from the output plane to the reflection plane and gradually increasing in width in a region from a first distance from the output plane toward the output plane, an upper surface of said ridge being set higher in a first region from a second distance from the output plane than an upper surface of said ridge in a second region other than the first region, and at least a portion of the second region being of a second conductivity type opposite the first conductivity type; and
   a mesa structure formed on the principal surface of said semiconductor substrate in areas on both sides of said ridge, said mesa structure having an upper surface defining a virtual flat plane at a position flush with or higher than a highest upper surface of said ridge,
   wherein a width of a cross section, parallel to the output plane, of said ridge is gradually broadened as a distance from said active layer becomes longer.

16. A semiconductor laser comprising:
   a semiconductor substrate of a first conductivity type having a principal surface, a laser output plane, and a laser reflection plane opposite the laser output plane;
   an active layer formed on the principal surface of said semiconductor substrate continuously at least from the output plane to the reflection plane, said active layer being gradually thinned toward the output plane in a region from a certain distance from the output plane toward the reflection plane;
   a ridge formed on said active layer and made of semiconductor material, said ridge extending from the output plane to the reflection plane and gradually increasing in width in a region from a first distance from the output plane toward the output plane, an upper surface of said ridge being set higher in a first region from a second distance from the output plane than an upper surface of said ridge in a second region other than the first region, and at least a portion of the second region being of a second conductivity type opposite the first conductivity type; and
   a mesa structure formed on the principal surface of said semiconductor substrate in areas on both sides of said ridge, said mesa structure having an upper surface defining a virtual flat plane at a position flush with or higher than a highest upper surface of said ridge,
   wherein a lower layer of said ridge is a cladding layer made of semiconductor material of the second conductivity type, and the first region includes the cladding layer and a high resistance layer formed on the cladding layer and having a resistance higher than the cladding layer or a semiconductor layer of the first conductivity type formed on the cladding layer, and
   wherein a width of a cross section, parallel to the output plane, of said ridge is gradually broadened as a distance from said active layer becomes longer.

17. A semiconductor laser comprising:
   a semiconductor substrate of a first conductivity type having a principal surface, a laser output plane, and a laser reflection plane opposite the laser output plane;
   an active layer formed on the principal surface of said semiconductor substrate continuously at least from the output plane to the reflection plane, said active layer being gradually thinned toward the output plane in a region from a certain distance from the output plane toward the reflection plane;
   a ridge formed on said active layer and made of semiconductor material, said ridge extending from the output plane to the reflection plane and gradually increasing in width in a region from a first distance from the output plane toward the output plane, an upper surface of said ridge being set higher in a first region from a second distance from the output plane than an upper surface of said ridge in a second region other than the first region, and at least a portion of the second region being of a second conductivity type opposite the first conductivity type; and
   a mesa structure formed on the principal surface of said semiconductor substrate in areas on both sides of said ridge, said mesa structure having an upper surface defining a virtual flat plane at a position flush with or higher than a highest upper surface of said ridge,
   wherein the first region is made of semiconductor material having a resistance higher than the second region, and
   wherein a width of a cross section, parallel to the output plane, of said ridge is gradually broadened as a distance from said active layer becomes longer.

* * * * *